US009431092B2

(12) United States Patent
Lim

(10) Patent No.: US 9,431,092 B2
(45) Date of Patent: Aug. 30, 2016

(54) MEMORY DEVICE AND MEMORY SYSTEM INCLUDING THE SAME

(71) Applicant: SK hynix Inc., Gyeonggi-do (KR)

(72) Inventor: Yu-Ri Lim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 69 days.

(21) Appl. No.: 14/572,358

(22) Filed: Dec. 16, 2014

(65) Prior Publication Data

US 2016/0055896 A1 Feb. 25, 2016

(30) Foreign Application Priority Data

Aug. 22, 2014 (KR) ........................ 10-2014-0109423

(51) Int. Cl.
| G11C 7/00 | (2006.01) |
| G11C 11/408 | (2006.01) |
| G11C 11/406 | (2006.01) |
| G11C 8/12 | (2006.01) |

(52) U.S. Cl.
CPC ........ G11C 11/408 (2013.01); G11C 11/40611 (2013.01); G11C 11/40618 (2013.01); *G11C 8/12* (2013.01)

(58) Field of Classification Search
CPC . G11C 11/408; G11C 8/12; G11C 11/40611; G11C 11/40618
USPC ................. 365/222, 230.03, 230.06, 230.09, 365/230.04, 236
See application file for complete search history.

(56) References Cited

U.S. PATENT DOCUMENTS

| 2002/0141270 A1* | 10/2002 | Yagishita | G11C 7/1006 365/222 |
| 2002/0191467 A1* | 12/2002 | Matsumoto | G11C 11/406 365/222 |
| 2003/0081485 A1* | 5/2003 | Matsumoto | G11C 11/406 365/222 |
| 2005/0243627 A1* | 11/2005 | Lee | G11C 11/406 365/222 |
| 2008/0049532 A1* | 2/2008 | Kajigaya | G11C 8/12 365/222 |
| 2008/0212386 A1* | 9/2008 | Riho | G11C 5/025 365/222 |
| 2012/0026813 A1* | 2/2012 | Sato | G11C 11/406 365/194 |
| 2014/0016422 A1* | 1/2014 | Kim | G11C 7/00 365/222 |
| 2015/0085564 A1* | 3/2015 | Yoon | G11C 11/40611 365/149 |
| 2015/0162067 A1* | 6/2015 | Kim | G11C 11/40611 365/222 |

FOREIGN PATENT DOCUMENTS

| KR | 1020120075322 | 7/2012 |
| KR | 1020130117424 | 10/2013 |

* cited by examiner

*Primary Examiner* — Viet Q Nguyen
(74) *Attorney, Agent, or Firm* — IP & T Group LLP

(57) ABSTRACT

A memory device includes a plurality of memory blocks; an address counter suitable for generating a counted address which is used for a normal refresh operation and changed when all the memory blocks are refreshed; a target address generator suitable for generating a target address used for a target refresh operation, wherein the target address corresponds to an address of a word line to be additionally refreshed in the memory blocks; and a refresh controller suitable for controlling the memory blocks to be refreshed at different times during a first normal refresh operation, controlling a memory block among the memory blocks, which is first refreshed in the first normal refresh operation, to be refreshed through the target refresh operation, and controlling the memory block, which is first refreshed in the first normal refresh operation, to be refreshed last during a second normal refresh operation, based on the refresh command.

10 Claims, 9 Drawing Sheets

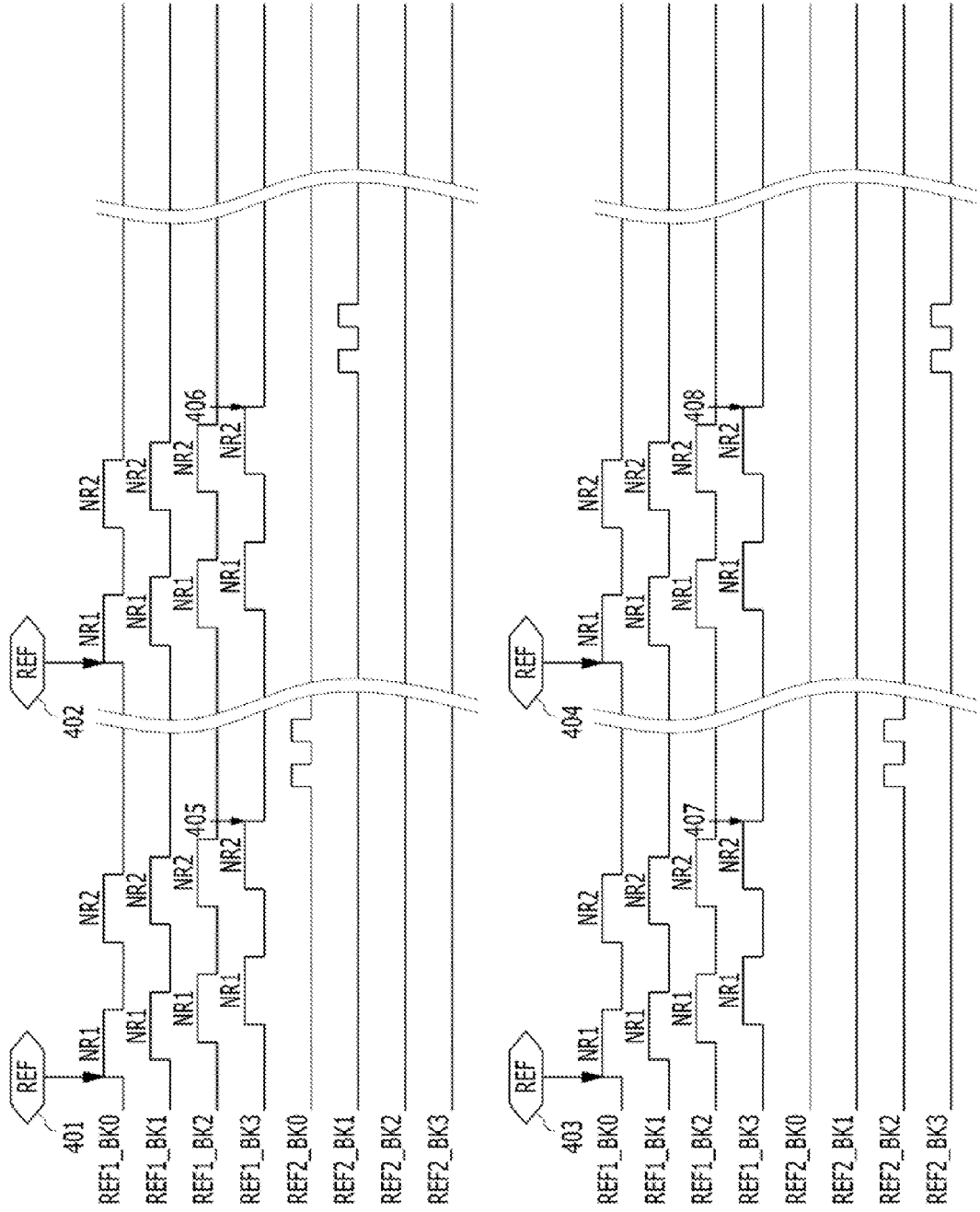

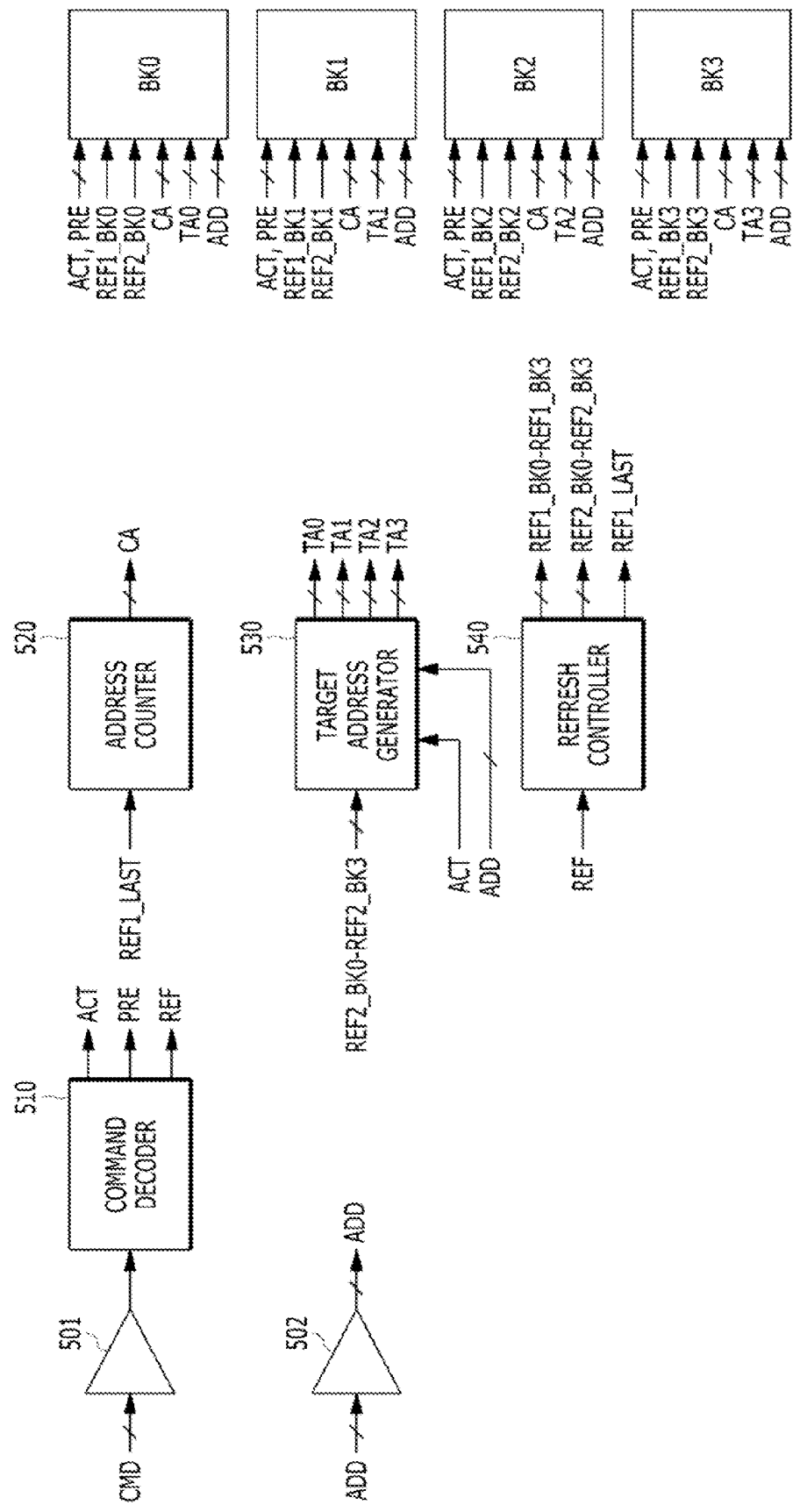

MEMORY DEVICE AND MEMORY SYSTEM INCLUDING THE SAME

CROSS-REFERENCE TO RELATED APPLICATIONS

The present application claims priority of Korean Patent Application No. 10-2014-0109423, filed on Aug. 22, 2014, which is incorporated herein by reference in its entirety.

BACKGROUND

1. Field

Various embodiments of the present invention relate to a memory device and a memory system including the same.

2. Description of the Related Art

A memory device includes a plurality of memory cells. A memory cell may include a transistor serving as a switch and a capacitor for storing electric charges corresponding to data. Data stored in the capacitor of the memory cell is determined according to the amount of charge stored in the capacitor. When the charge is large, the corresponding memory cell is determined to store high data (logic 1). When the electric charges are discharged, the corresponding memory cell is determined to store low data (logic 0).

Since data is retained in the form of a charge in a capacitor, in principle no power is consumed. However, since the initial electric charge is lost to leakage current through a PN junction of an MOS transistor or the like, data may be lost. In order to prevent such data loss, the data stored in the memory cell is to be read before the data is lost, and the capacitor is to be recharged according to the read information. Such a recharging operation, which is referred to as a refresh operation, needs to be periodically repeated to retain the data.

A refresh operation is performed whenever a refresh command is inputted to a memory device from a memory controller. The memory controller inputs the refresh command to the memory at each predetermined time in consideration of the data retention time of the memory device. The data retention time may indicate a time during which data of a memory cell may be retained without a refresh operation. Since memory cells included in a memory device are designed to have a data retention time which is equal to or longer than a preset reference time, an interval between the refresh operations may be determined in consideration of the reference time.

However, when some memory cells have data retention time that is less than the reference time, due to internal or external factors, data of the memory cells may be degraded or lost. Internal factors include memory cell defects. Examples of internal factors include capacitors of the memory cells having relatively low capacitance or transistors having a large amount of leakage current. Furthermore, external factors include the influence of active-precharge operations of neighboring word lines.

FIG. 1 illustrates a cell array included in a memory device. In FIG. 1, 'BL's represent bit lines.

Referring to FIG. 1, WLK−1, WLK, and WLK+1 represent three word lines successively arranged in parallel, WLK with ATTACK_WL represents a highly active word line of which the number of activations or active frequency is high, or of which the active time is long. WLK−1 and WLK+1 represent adjacent word lines arranged adjacent to the highly active word line WLK. Furthermore, CELL_K−1, CELL_K, and CELL_K+1 represent memory cells coupled to the word lines WLK−1, WLK, and WLK+1, respectively. The memory cells CELL_K−1, CELL_K, and CELL_K+1 include cell transistors TR_K−1, TR_K, and TR_K+1 and cell capacitors CAP_K−1, CAP_K, and CAP_K+1, respectively.

In FIG. 1, when the word line WLK is activated a large number of times, activated at a high frequency, or activated for a long time, the voltage of the word line WLK may be frequently toggled or maintained at a high voltage for a long time, thereby influencing data stored in the memory cells CELL_K−1 and CELL_K+1 coupled to the adjacent word lines WLK−1 and WLK+1 due to couplings between the highly active word line WLK and the adjacent word lines WLK−1 and WLK+1. Such influence may reduce data retention time.

SUMMARY

Various embodiments are directed to a memory device capable of changing the order in which a plurality of memory blocks are refreshed during a normal refresh operation, thereby reducing the time required for performing the normal and target refresh operations, and a memory system including the same.

In addition, various embodiments are directed to a memory device capable of reducing errors through target refresh operations, and a memory system including the same.

In an embodiment of the present invention, a memory device may include: a plurality of memory blocks; a plurality of memory blocks; an address counter suitable for generating a counted address which is used for a normal refresh operation and changed when all the memory blocks are refreshed; a target address generator suitable for generating a target address used for a target refresh operation, wherein the target address corresponds to an address of a word line to be additionally refreshed in the memory blocks; and a refresh controller suitable for controlling the memory blocks to be refreshed at different times during a first normal refresh operation, controlling a memory block among the memory blocks, which is first refreshed in the first normal refresh operation, to be refreshed through the target refresh operation, and controlling the memory block, which is first refreshed in the first normal refresh operation, to be refreshed last during a second normal refresh operation, based on the refresh command.

In an embodiment of the present invention, a memory device may include: first to Nth memory blocks; and a refresh controller suitable for controlling the first to Nth memory blocks to be refreshed in a specific order in a first normal refresh operation controlling a memory block among the memory blocks, which is first refreshed in the first normal refresh operation, to be refreshed through a target refresh operation, and controlling the first to Nth memory blocks to be refreshed in a reverse order to the specific order in a second normal refresh operation, based on the refresh command.

In an embodiment of the present invention, a memory system may include: a memory device that includes a plurality of memory blocks and is suitable for refreshing the memory blocks at different times during a first normal refresh operation, refreshing a memory block among the memory blocks, which is first refreshed in the first normal refresh operation, through a target refresh operation, and refreshing the memory blocks during a second normal refresh operation such that the memory block, which is first refreshed in the first normal refresh operation, is refreshed last, based on the refresh command; and a memory controller suitable for periodically applying the refresh command to the memory device.

In an embodiment of the present invention, an operating method of a memory device with a plurality of memory blocks, may include: refreshing the memory blocks at different times in a specific order during a first normal refresh; refreshing a memory block among the memory blocks, which is first refreshed in the first normal refresh operation through a target refresh operation; and refreshing the memory blocks in a reverse order to the specific order during a second normal refresh operations such that the memory block, which is first refreshed in the first normal refresh operation, is refreshed last.

BRIEF DESCRIPTION OF THE DRAWINGS

FIGS. 4A and 4B are diagrams for explaining an operation of a memory device when AR and TR operations are performed together.

FIG. 5 is a block diagram illustrating a memory device in accordance with an embodiment of the present invention.

DETAILED DESCRIPTION

Figure 1:
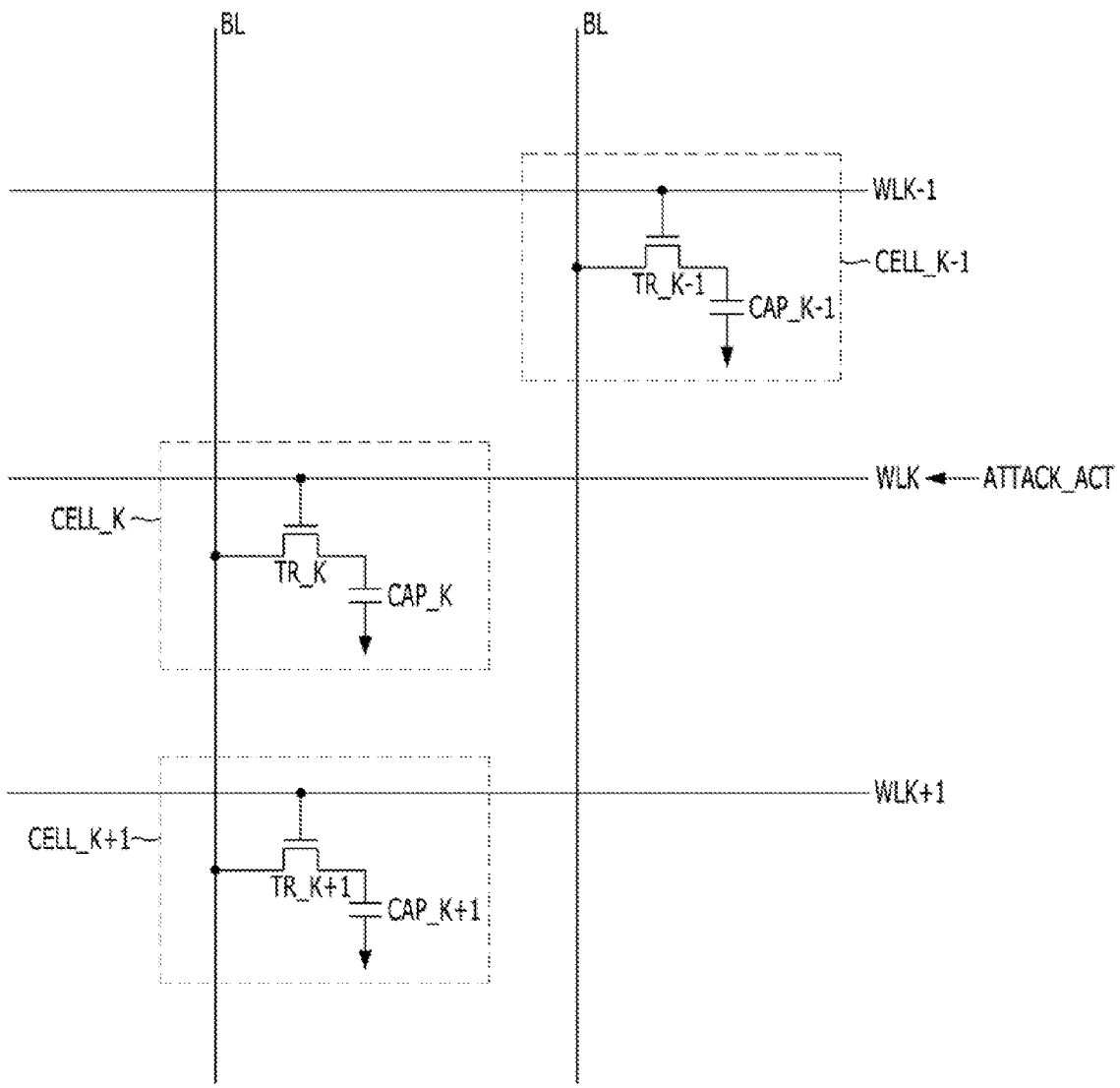
FIG. 1 is a diagram illustrating a cell array included in a memory device.

Various embodiments will be described below in snore detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It is also noted that in this specification, "connected/coupled" refers to one component not only directly coupling another component but also indirectly coupling another component through an intermediate component. In addition, a singular form may include a plural form as long as it is not specifically mentioned in a sentence. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. When a first layer is referred to as being "on" a second layer or "on" a substrate, it not only refers to the first layer being formed directly on the second layer or the substrate but also when a third layer exists between the first layer and the second layer or the substrate.

Figure 2:
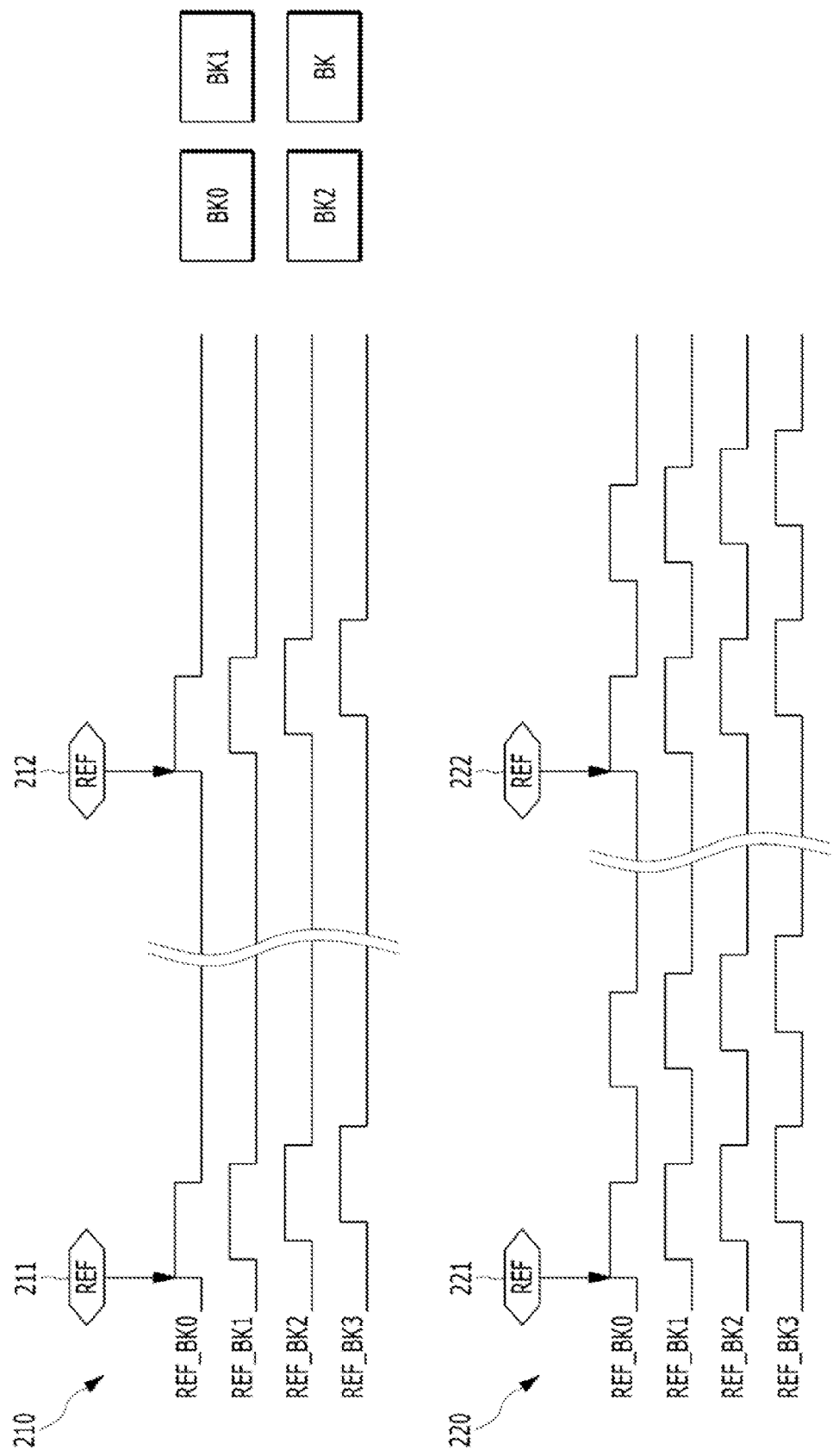
FIG. 2 is a diagram for explaining an advanced refresh (AR) operation.

FIG. 2 is a diagram for explaining an advanced refresh (AR) operation. In FIG. 2, reference numeral 210 represents a general refresh operation, and reference numeral 220 represents an AR operation. FIG. 2 illustrates a refresh operation of a memory device including four memory blocks BK0 to BK3 and refresh signals REF_BK0 to REF_BK3 may indicate that the corresponding memory blocks are refreshed (i.e., activated-precharged).

In the case of the general refresh operation 210, one refresh operation may be performed whenever a refresh command is inputted. When the refresh signals REF_BK0 to REF_BK3 are activated once, it may indicate that one refresh operation is performed in response to one refresh command. On the other hand, in the case of the AR operation 220, two refresh operations may be performed whenever a refresh command is inputted. When the refresh signals REF_BK0 to REF_BK3 are activated twice whenever a refresh command 221 or 222 is inputted, it may indicate that two refresh operations are performed in response to one refresh command 221 or 222.

FIG. 2 illustrates that one word line of a refresh target block is refreshed through the general refresh operation 210 and two word lines of the refresh target block are refreshed through the AR operation 220, whenever a refresh command is inputted. As such, the AR operation may increase the number of refresh operations (or reduce the interval of refresh operations) and thus retain data of memory cells even when the data retention time of the memory cells is decreased.

Referring to FIG. 2, the refresh signals REF_BK0 to REF_BK3 may be activated with a slight time difference provided therebetween, in order to reduce peak current caused by the refresh operation. Such a refresh scheme may be referred to as a piled refresh scheme. In FIG. 2, since the refresh signals are activated four times, the refresh scheme may be referred to as a four-piled refresh scheme.

For reference, while FIG. 2 illustrates the case in which the average number of refresh operations is two per one refresh command REF, the average number of refresh operations per one refresh command REF may differ depending on design. For example, when one refresh operation is performed when the refresh command REF is inputted for the first time, for the second time, and for the third time, and two refresh operations are performed when the refresh command REF is inputted for the fourth time, the average number of refresh operations per one refresh command REF may be set to 1.25 (5/4: five refresh operations are performed while the refresh command is inputted four times).

Figure 3:
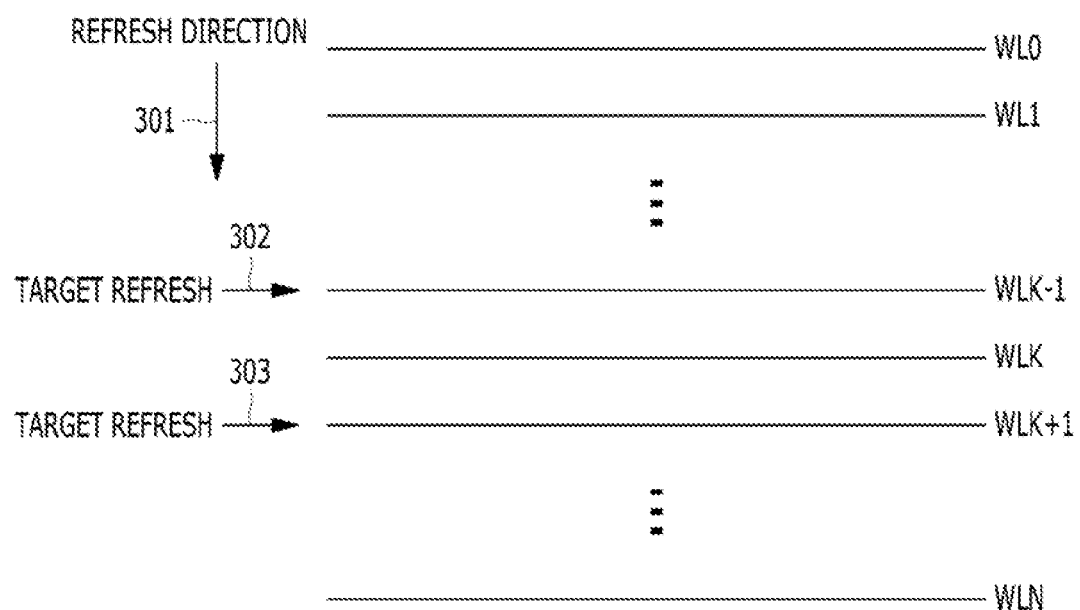
FIG. 3 is a diagram for explaining a target refresh (TR) operation.

FIG. 3 is a diagram for explaining a target refresh (TR) operation. FIG. 3 illustrates a plurality of word lines WL0 to WLN included in a block.

Referring to FIG. 3, during a refresh operation that is not a target refresh operation (hereafter, referred to as a normal refresh operation), one or more word lines may be refreshed whenever a refresh command is inputted, and word lines WL0 to WLN may be sequentially refreshed in a direction indicated by an arrow 301. Furthermore, after the refresh operation for the word line WLN is completed, the word lines may be sequentially refreshed again from the word line WL0.

In the case of a target refresh operation, a selected word line may be refreshed according to a preset condition as indicated by reference numeral 302 or 303, regardless of whether the normal refresh operation is performed. At this time, the target-refreshed word line may include word lines which are required to be additionally refreshed because it may be difficult to retain data only through the normal refresh operations. Thus, in the case of the target refresh operation, word lines to be refreshed are not consecutive, but a different word line may be refreshed whenever a refresh command is inputted.

When the target refresh operation is used to resolve the concern described with reference to FIG. 1, the word line WLK of FIG. 1 may be detected according to a preset condition, the detection result may be used to generate a target address, and the target address may be used to refresh a word line WLK−1 and a word line WLK+1.

Figure 4A:
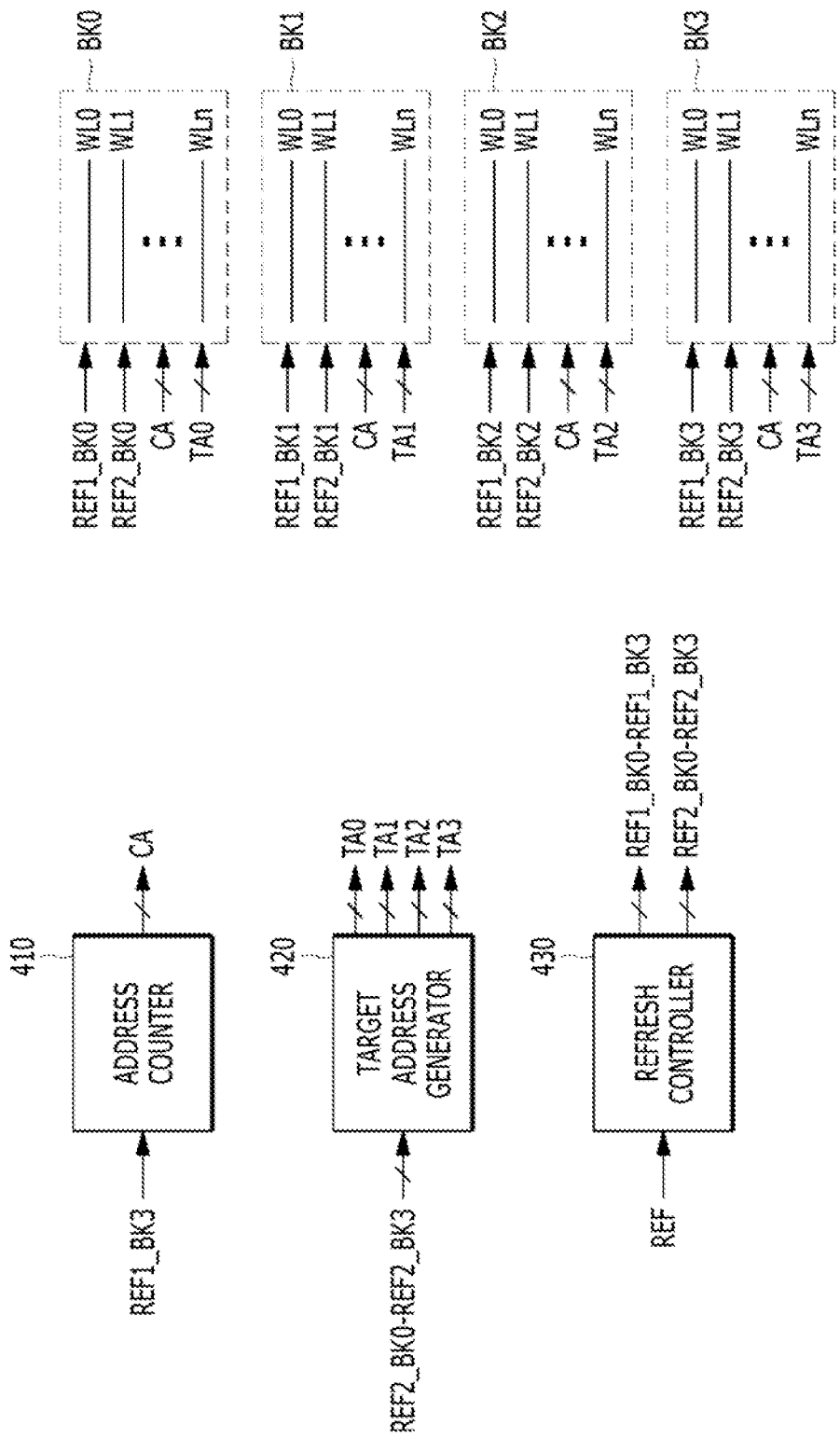

FIGS. 4A and 4B are diagrams for explaining an operation of a memory device when advanced refresh and target refresh operations are performed together.

Referring to FIG. 4A, the memory device may include an address counter 410, a target address generator 420, a refresh controller 430, and memory blocks BK0 to BK3 each including a plurality of word lines WL0 to WLN. FIG. 46 is a waveform diagram illustrating the operation of the memory device. In FIG. 4B, REF1_BK0 to REF1_BK3 may represent normal refresh operations of the corresponding memory blocks BK0 to BK3, and REF2_BK0 to REF2_BK3 may represent target refresh operations of the corresponding memory blocks BK0 to BK3.

The refresh controller 430 may control the memory blocks BK0 to BK3 to be refreshed twice through normal refresh operations NR1 and NR2 whenever a refresh command REF is inputted as indicated by reference numerals 401 to 404, and control the memory blocks BK0 to BK3 to be sequentially refreshed one by one through target refresh operations TR1 and TR2 whenever the refresh command REF is inputted as indicated by reference numerals 401 to 404. The refresh controller 430 may control the memory block BK0 to be target-refreshed when the refresh command REF is inputted for the first time as indicated by reference numeral 401, control the memory block BK1 to be target-refreshed when the refresh command REF is inputted for the second time as indicated by reference numeral 402, control the memory block BK2 to be target-refreshed when the refresh command REF is inputted for the third time as indicated by reference numeral 403, and control the memory block BK3 to be target-refreshed when the refresh command REF is inputted for the fourth time as indicated by reference numeral 404.

An address used for selecting a word line in the normal refresh operations NR1 and NR2 may include a counted address CA generated by the address counter 410, and an address used for selecting a word line in the target refresh operations TR1 and TR2 may include target addresses TA0 to TA3 generated by the target address generator 420.

The address counter 410 may increase the value of the counted address CA by 1 whenever all the memory blocks BK0 to BK3 are completely refreshed, such that the word lines are sequentially refreshed in each of the memory blocks BK0 to BK3. In order to update the counted address CA whenever all the memory blocks BK0 to BK3 are completely refreshed, the address counter 410 may increase the value of the counted address CA by 1, whenever a refresh signal REF1_BK3 is deactivated as indicated by reference numeral 405 to 408. The signal REF1_BK3 may be used to control the refresh operation of the memory block BK3 which is finally refreshed (i.e. refreshed last) among the memory blocks. Furthermore, when the value of the address is increased by 1, it may indicate that the counted address CA is changed so that a (K+1)th word line is selected next when a Kth word line is currently selected.

The target address generator 420 may detect and store the address of the word line WLK described with reference to FIG. 3. When the refresh signals REF2_BK0 to REF2_BK3 are activated, the target address generator 420 may generate and output target addresses TA0 to TA3 corresponding to the activated refresh signals. For example, suppose that addresses detected from the memory blocks BK0 to BK3 are represented by WLK1 to WLK4, which have different values. In this case, the target address generator 420 may generate and output addresses corresponding to the word lines WLK1−1 to WLK4−1 when the refresh signals REF2_BK0 to REF2_BK3 are activated for the first time, and generate and output addresses corresponding to the word lines WLK1+1 to WLK4+1 when the refresh signals REF2_BK0 to REF2_BK3 are activated for the second time.

When the refresh signals REF1_BK0 to REF1_BK3 are activated, the memory blocks BK0 to BK3 may refresh word lines corresponding to the counted address CA, and when the signals REF2_BK0 to REF2_BK3 are activated, the memory blocks BK0 to BK3 may refresh word lines corresponding to the target addresses TA0 to TA3. At this time, after the memory block BK3 which is finally refreshed in the first refresh operation is completely refreshed, the counted address CA may be updated. The second refresh operation of the normal refresh operation may be started after the counted address CA is updated. Furthermore, a target refresh operation needs to be started at a predetermined time after the second refresh operation of the memory block in which the target refresh operation is performed. Thus, a considerable amount of time may be required until the normal and target refresh operations corresponding to the refresh commands 401 to 404 are completed.

FIG. 5 is a block diagram illustrating a memory device in accordance with an embodiment of the present invention.

Referring to FIG. 5, the memory device may include a command receiver 501, an address receiver 502, a command decoder 510, an address counter 520, a target address generator 530, a refresh controller 540, and a plurality of memory blocks BK0 to BK3.

The command receiver 501 may receive a command CMD from outside the memory device. The command CMD may include a plurality of signals. For example, the signal's included in the command CMD may include a chip select signal CS, an active signal ACT, a row address strobe signal RAS, a column address strobe signal CAS, and a write enable signal WE.

The address receiver 502 may receive an address ADD corresponding to a multi-bit signal inputted from outside the memory device. The address ADD may include a row address and a column address. The row address and the column address may be inputted through the same pad. An address inputted in synchronization with a row address strobe signal may be recognized as a row address by the memory device, and an address inputted in synchronization with a column address strobe signal may be recognized as a column address by the memory device.

The command decoder 510 may decode the command CMD received through the command receiver 501, and generate an active command ACT, a precharge command PRE, and a refresh command REF which are internal commands. The command decoder 510 may activate a command corresponding to a combination of signals forming the command CMD among the above-described commands ACT, PRE, and REF. The command decoder 510 may receive a part of the address ADD as well as the command CMD, and use the received address for decoding. In this case, the command decoder 510 may use a combination of commands CMD, which are inputted through a plurality of cycles, for decoding.

The refresh controller 540 may control a refresh operation of the memory device in response to a refresh command REF. The refresh operation may be controlled by activating first and second refresh signals REF1_BK0 to REF1_BK3 and REF2_BK0 to REF2_BK3 corresponding to the respective memory blocks BK0 to BK3. The first refresh signals REF1_BK0 to REF1_BK3 may be used for controlling the normal refresh operations of the memory blocks BK0 to BK3, and the second refresh signals REF2_BK0 to REF2_BK3 may be used for controlling the target refresh operations of the memory blocks BK0 to BK3.

The refresh controller 540 may control the memory blocks BK0 to BK3 to be refreshed at different times during a first normal refresh operation corresponding to the refresh command REF. When the memory blocks BK0 to BK3 are refreshed at different times, it may indicate that the refresh operations of the memory blocks BK0 to BK3 are started at different times, and completed at different times. Such a refresh operation may correspond to the above-described piled refresh operation.

The refresh controller 540 may control the memory block which is first refreshed in the first normal refresh operation, such that the block is target-refreshed. Furthermore, the refresh controller 540 controls the memory blocks BK0 to BK3 to be refreshed at different times during a second normal refresh operation corresponding to the refresh command REF. In this case, the memory block that is first refreshed in the first normal refresh operation may be controlled to be finally refreshed in the second normal refresh operation. In particular, the order in which the memory blocks BK0 to BK3 are refreshed in the second normal refresh operation may be reverse to the order in which the memory blocks BK0 to BK3 are refreshed in the first normal refresh operation.

The refresh controller 540 may change the memory block which is first refreshed among the memory blocks BK0 to BK3 in the first refresh operation, whenever the refresh command REF is applied. Furthermore, the refresh controller 540 may change a memory block to be target-refreshed, whenever the refresh command REF is applied. The refresh controller 540 may control the target refresh operation to be started when the memory block that is finally refreshed in the first normal refresh operation is completely refreshed.

The address counter 520 may generate a counted address CA used for a normal refresh operation through counting. The address counter 520 may increase the value of the counted address CA by 1 by performing counting whenever all the memory blocks BK0 to BK3 are completely refreshed. For this operation, the address counter 520 may change the counted address CA in response to deactivation of the refresh signal REF1_LAST of the memory block which is finally refreshed among the memory blocks BK0 to BK3. When the value of the address is increased by 1, it may indicate that the counted address CA is changed so that a (K+1)th word line is selected next when a Kth word line is currently selected.

The target address generator 530 may generate the target addresses TA0 to TA3 used for the target refresh operation. The target address generator 530 may generate the address of a word line to be target-refreshed, due to the above-described internal or external factors.

For example, the target address generator 530 may previously store the addresses of word lines coupled to memory cells which have a shorter data retention time than other memory cells due to defects. Then, the target address generator 530 may output the stored addresses as the target addresses TA0 to TA3 during a target refresh operation.

Furthermore, the target address generator 530 may detect and store the address of a word line of which the number of activations or active frequency is high or of which the active time is long, and output addresses corresponding to word lines adjacent to the word line as the target address TA0 to TA3 during the target refresh operation. At this time, when the detected and stored address is the address of a Kth word line, the target address generator 530 may generate addresses of a (K−1)th word line and a (K+1)th word line, and output the generated addresses as the target addresses TA0 to TA3.

When one or more second refresh signals are activated among the second refresh signals REF2_BK0 to REF2_BK3, the target address generator 530 may output the target address of a memory block corresponding to the activated second refresh signal. The target address generator 530 may output the address of the (K−1)th word line when the second refresh signals REF2_BK0 to REF2_BK3 are activated for the first time, and output the address of the (K+1)th word line when the second refresh signals REF2_BK0 to REF2_BK3 are activated for the second time.

For reference, the target refresh generator 530 may store the number of activations, the active history, or the active time of each word line in each bank, compare the number of activations, the active history, or the active time to reference information (e.g., a reference number, a reference frequency, or a reference time), and store the address ADD of a word line of which the number of activations is larger than the reference number, of which the active frequency is higher than the reference frequency, or of which the active time is longer than the reference time. For this operation, the target address generator 530 may receive the active command ACT and the address ADD and use the received command and address for word line detection. The address ADD may include an address (e.g., a bank address) for selecting a memory block among the memory blocks BK0 to BK3 and an address (e.g., a row address) for selecting a word lime in the memory block.

The active history may include information on the history in which word lines have been activated as the active commands ACT are sequentially inputted. For example, the active history may include information indicating which word lines have been activated during first to Pth active operations. The active frequency may correspond to how many times a specific word line of a specific bank has been activated during a preset number of active operations. For example, Table 1 shows the active history of a bank X.

TABLE 1

| | Active operation No. | | | | | | | | | | |
|---|---|---|---|---|---|---|---|---|---|---|---|
| | 1 | 2 | 3 | 4 | 5 | 6 | 8 | 9 | 10 | 11 | 12 |
| Activated word line | 7 | 1 | 5 | 34 | 56 | 23 | 12 | 7 | 7 | 43 | 53 |

Referring to Table 1, the seventh word line is activated once at every three active operations (i.e., 1-3, 4-6, 7-9, and 10-12). In this case, the active frequency of the seventh word line may be set to one time per three active operations.

The target address generator 530 may not be limited to the above-described example, but store the address of a word line satisfying a condition which may have influence on data of memory cells coupled to adjacent word lines in relation with an active operation, and generate the addresses of word lines adjacent to the word line as target addresses.

Each of the memory blocks BK0 to BK3 may include a plurality of word lines each coupled to a plurality of memory cells. In FIG. 5, the word lines and the memory cells are omitted for convenience. The blocks BK0 to BK3 may refresh a word line corresponding to the counted address CA when the corresponding first refresh signals REF1_BK0 to REF1_BK3 are activated, and refresh word lines corresponding to the target addresses TA0 to TA3 when the corresponding second refresh signals REF2_BK0 to REF2_BK3 are activated. The memory blocks BK0 to BK3 may activate a word line corresponding to the address ADD when the active command ACT is applied, and precharge the activated word line when the precharge command PRE is applied.

Figure 6:
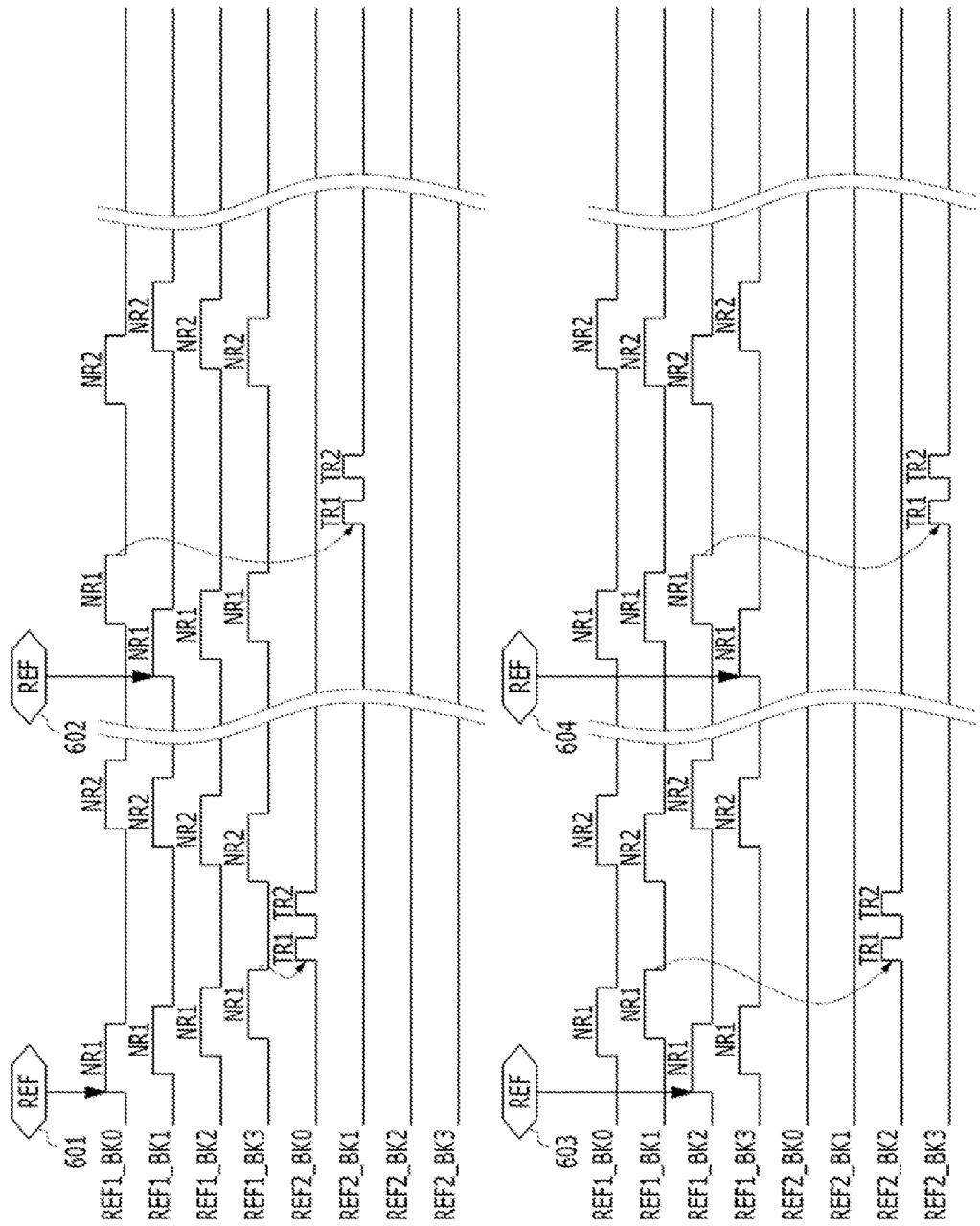
FIG. 6 is a timing diagram for explaining a refresh operation of the memory device shown in FIG. 5.

FIG. 6 is a timing diagram for explaining a refresh operation of the memory device shown in FIG. 5.

In FIG. 6, REF1_BK0 to REF1_BK may indicate that the memory blocks BK0 to BK3 are normally refreshed according to the control of the refresh controller 540, and REF2_BK0 to REF2_BK3 may indicate that the memory blocks BK0 to BK3 are target-refreshed according to the control of the refresh controller 540.

(1) When the refresh command REF is applied for the first time as indicated by reference numeral 501, the memory blocks may be sequentially refreshed in order of BK0, BK1, BK2, and BK3 during the first normal refresh operation NR1. When the memory block BK3 which is finally refreshed in the first normal refresh NR1 is completely refreshed, the memory block BK0 which is first refreshed in the first normal refresh operation NR1 may be target-refreshed as indicated by TR1 and TR2. During the second normal refresh operation NR2, the memory blocks may be sequentially refreshed in order of BK3, BK2, BK1, and BK0.

(2) When the refresh command REF is applied for the second time as indicated by reference numeral 602, the memory blocks may be sequentially refreshed in order of BK1, BK2, BK3 and BK0 during the first normal refresh operation NR1. When the memory block BK0 which is finally refreshed in the first normal refresh NR1 is completely refreshed, the memory block BK1 which is first refreshed in the first normal refresh operation NR1 may be target-refreshed as indicated by TR1 and TR2. During the second normal refresh operation NR2, the memory blocks may be sequentially refreshed in order of BK0, BK3, BK2, and BK1.

(3) When the refresh command REF is applied for the third time as indicated by reference numeral 603, the memory blocks may be sequentially refreshed in order of BK2, BK3, BK0, and BK1 during the first normal refresh operation NR1. When the memory block BK1 which is finally refreshed in the first normal refresh operation NR1 is completely refreshed, the memory block BK2 which is first refreshed in the first normal refresh operation NR1 may be target-refreshed as indicated by TR1 and TR2. During the second normal refresh operation NR2, the memory blocks may be sequentially refreshed in order of BK1, BK0, BK3, and BK2.

(4) When the refresh command REF is applied for the fourth time as indicated by reference numeral 604, the memory blocks may be sequentially refreshed in order of BK3, BK0, BK1, and BK2 during the first normal refresh operation NR1. When the memory block BK2 which is finally refreshed in the first normal refresh operation NR1 is completely refreshed, the memory block BK3 which is first refreshed in the first normal refresh operation NR1 may be target-refreshed as indicated by TR1 and TR2. During the second refresh operation NR2, the memory devices may be refreshed in order of BK2, BK1, BK0, and BK3. Then, when a refresh command is applied, the refresh operations (1) to (4) may be repeated.

During the refresh operations (1) to (4) which are performed in response to the refresh command REF, the memory block which is first refreshed in the first normal refresh operation may be finally refreshed in the second normal refresh operation, and target-refreshed between the first and second normal refresh operations.

Referring to the drawing related to the refresh operation corresponding to the refresh command 401, the memory device of FIG. 5 may perform a target refresh operation between the first and second normal refresh operations. Thus, as the counted address CA is updated during the target refresh operations TR1 and TR2, the time required for updating the counted address CA does not need to be separately secured. Furthermore, the memory block BK0 which is first refreshed in the first normal refresh operation may be finally refreshed in the second normal refresh operation, and target-refreshed between the first and second normal refresh operations, which makes it possible to secure sufficient time for performing the target refresh operation.

FIGS. 5 and 6 illustrate the case in which the memory block which is first refreshed in the first normal refresh operation is changed in order of BK0, BK1, BK2, and BK3, and the order in which the memory blocks are refreshed in the first normal refresh operation is reverse to the order in which the memory blocks are refreshed in the second normal refresh operation. However, the order in which the memory block which is first refreshed in the first normal refresh operation is changed may differ depending on design. Furthermore, when the memory device is designed in such a manner that the memory block which is first refreshed in the first normal refresh operation is finally refreshed in the second refresh operation and target-refreshed between the first and second normal refresh operations, the order in which the memory blocks are refreshed in the first normal refresh operation does not need to be reverse to the order in which the memory block are refreshed in the second normal refresh operation.

Figure 7:
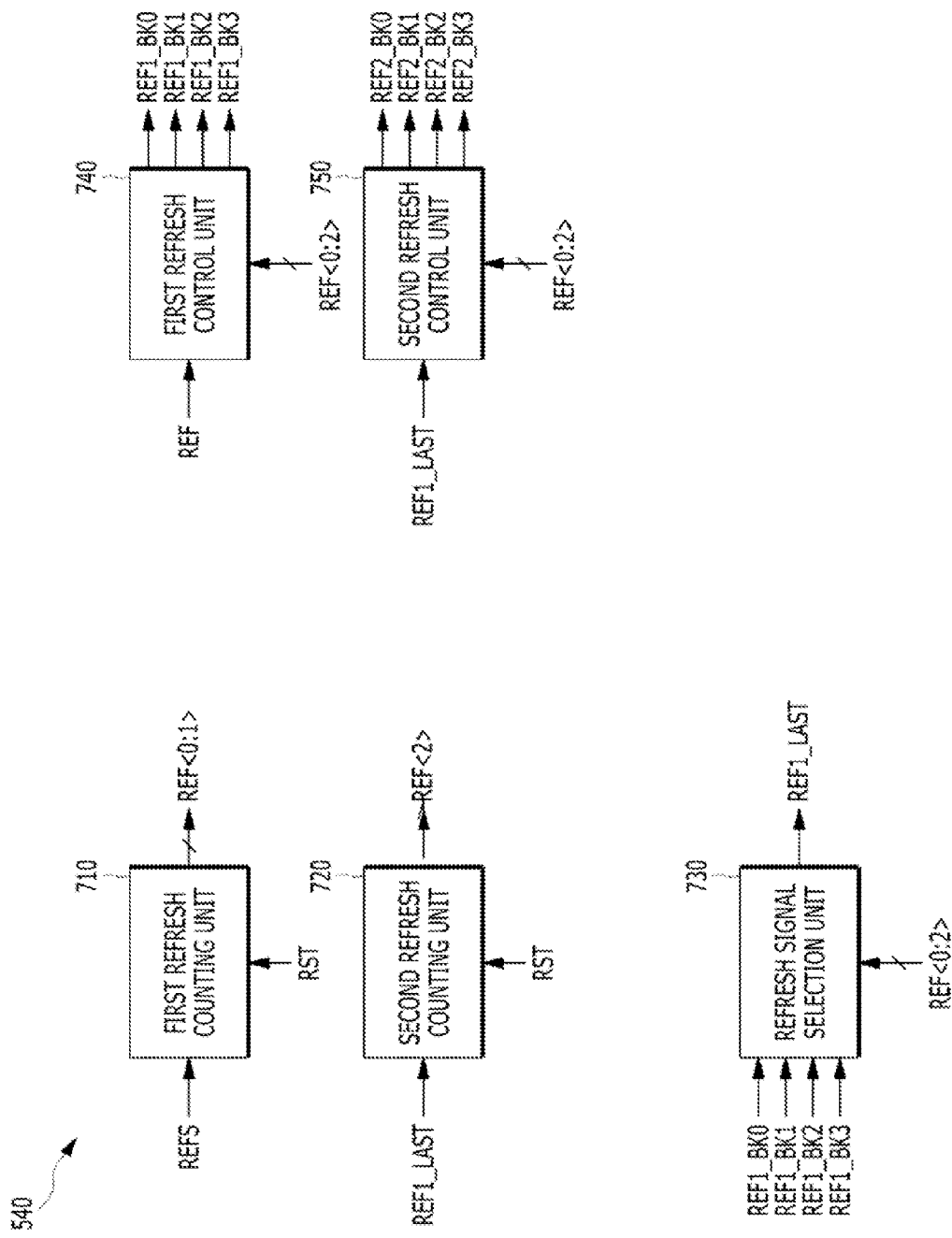
FIG. 7 is a detailed diagram of a refresh controller shown in FIG. 5.

FIG. 7 is a detailed diagram of the refresh controller 540 shown in FIG. 5.

Referring to FIG. 7, the refresh controller 540 may include first and second refresh counting units 710 and 720, a refresh signal selection unit 730, a first refresh control unit 740, and a second refresh control unit 750.

The first refresh counting unit 710 may generate first refresh counting information REF<0:1> by performing counting whenever a refresh operation is completed in response to the refresh command REF. In FIG. 7, REFS represents a signal which is activated while the memory device performs a refresh operation. The signal REFS may be activated in response to the refresh command REF, and deactivated when a preset time elapses. The memory device may perform the first and second normal refresh operations and the target refresh operation in a period where the signal REFS is activated in response to the refresh command REF.

The first refresh counting information REF<0:1> may indicate which refresh command REF the current refresh operation is performed in response to. For reference, the first refresh counting unit 710 may be reset when a reset signal RST is activated, and output the first refresh counting information REF<0:1> as '00' in a state where the first refresh counting unit 710 is reset. For example, when the first refresh counting information REF<0:1> is '00', the corresponding refresh operation is a refresh operation which is performed response to a first refresh command REF. When the first refresh counting information REF<0:1> is '10', the corresponding refresh operation is a refresh operation which is performed in response to a second refresh command REF. When the first refresh counting information REF<0:1> is '01', the corresponding refresh operation is a refresh operation which is performed in response to a third refresh command REF. When the first refresh counting information REF<0:1> is '11', the corresponding refresh operation is a refresh operation which is performed in response to a fourth refresh command REF. When the refresh operation performed in response to the fourth refresh command REF is completed, the first refresh counting information REF<0:1> may be reset to '00'.

The second refresh counting unit 720 may generate second refresh counting information REF<2> by performing counting whenever the refresh signal REF1_LAST is deactivated. The second refresh counting information REF<2> may indicate to which one of the first and second normal refresh operations the current refresh operation corresponds. For reference, the second refresh counting unit 710 may be reset when the reset signal RST is activated, and output the second refresh counting information REF<2> as '0' in a state where the second refresh counting unit 710 is reset. For example, when the second refresh counting information REF<2> is '0', the current refresh operation may correspond to the first normal refresh operation, and when the second refresh counting information REF<2> is '1', the current refresh operation may correspond to the second normal refresh operation. When the second normal refresh operation is completed, the second refresh counting information REF<2> may be reset to '0'.

The refresh signal section unit 730 may select a first refresh signal which is finally deactivated among the first refresh signals REF1_BK0 to REF1_BK3 in response to the refresh counting information REF<0:2>, and output the selected signal as the refresh signal REF1_LAST. The refresh signal selection unit 730 may select the first refresh signal REF1_BK3 and output the selected signal as the refresh signal REF1_LAST when the refresh counting information REF<0:2> is '000', and select the first refresh signal REF1_BK0 and output the selected signal as the refresh signal REF1_LAST when the refresh counting information REF<0:2> is 100'. The first refresh signals may indicate the first and second normal refresh operations corresponding to the first refresh command REF, respectively. The refresh signal selection unit 730 may select the first refresh signal REF1_ BK0 and output the selected signal as the refresh signal REF1_LAST when the refresh counting information REF<0:2> is '100', and select the first refresh signal REF1_BK1 and output the selected signal as the refresh signal REF1_LAST when the refresh counting information REF<0:2> is '101'. The first refresh signals may indicate the first and second normal refresh operations corresponding to the second refresh command REF, respectively. The refresh signal selection unit 730 may select the first refresh signal REF1_BK1 and output the selected signal as the refresh signal REF1_LAST when the refresh counting information REF<0:2> is '010', and select the first refresh signal REF1_BK2 and output the selected signal as the refresh signal REF1_LAST when the refresh counting information REF<0:2> is '011'. The first refresh signals may indicate the first and second normal refresh operations corresponding to the third refresh command REF, respectively. The refresh signal selection unit 730 may select the first refresh signal REF1_BK2 and output the selected signal as the refresh signal REF1_LAST when the refresh counting information REF<0:2> is '110', and select the first refresh signal REF1_BK3 and output the selected signal as the refresh signal REF1_LAST when the refresh counting information REF<0:2> is '111'. The first refresh signals may indicate the first and second normal refresh operations corresponding to the third refresh command REF, respectively.

The first refresh control unit 740 may generate the first refresh signals REF1_BK0 to REF1_BK3, and activate and deactivate the first refresh signals REF1_BK0 to REF1_BK3 according to an order determined in response to the refresh counting information REF<0:2>.

When the second refresh counting information REF<2> is '0', the first refresh control unit 740 may activate the first refresh signals REF1_BK0 to REF1_BK3 at different times, when the refresh command REF is applied. At this time, when the first refresh counting information REF<0:1> is '00', the first refresh control unit 740 may activate the first refresh signals in order of REF1_BK0, REF1_BK1, REF1_BK2, and REF1_BK3. Furthermore, when the first refresh counting information REF<0:1> is '10', the first refresh control unit 740 may activate the first refresh signals in order of REF1_BK1 REF1_BK2, REF1_BK3, and REF1_BK0. Furthermore, when the first refresh counting information REF<0:1> is '01', the first refresh control unit 740 may activate the first refresh signals in order of REF1_BK2, REF1_BK3, REF1_BK0, and REF1_BK1. Furthermore, when the first refresh counting information REF<0:1> is '11', the first refresh control unit 740 may activate the first refresh signals in order of REF1_BK3, REF1_BK0, REF1_BK1 and REF1_BK2.

Furthermore, when the second refresh counting information REF<2> is '1', the first refresh control unit 740 may activate the first refresh signals REF1_BK0 to REF1_BK3 at different times when a preset time elapses after the refresh signal REF1_LAST is deactivated. At this time, when the first refresh counting information REF<0:1> is '00', the first refresh control unit 740 may activate the first refresh signals in order of REF1_BK3, REF1_BK2, REF1_BK1, and REF1_BK0. Furthermore when the first refresh counting information REF<0:1> is '10', the first refresh control unit 740 may activate the first refresh signals in order of REF1_BK0, REF1_BK3, REF1_BK2, and REF1_BK1. Furthermore, when the first refresh counting information REF<0:1> is '01', the first refresh control unit 740 may activate the first refresh signals in order of REF1_BK1, REF1_BK0, REF1_BK3, and REF1_BK2. Furthermore, when the first refresh counting information REF<0:1> is '11', the first refresh control unit 740 may activate the first refresh signals in order of REF1_BK2, REF1_BK1, REF1_BK0, and REF1_BK3. The preset time may be determined according to the time required for performing the target refresh operation after the refresh signal REF1_LAST is deactivated.

The second refresh control unit 750 may generate the second refresh signals REF2_BK0 to REF2_BK3, and activate one of the second refresh signals REF2_BK0 to REF2_BK3 one or more times when the refresh signal REF1_LAST is deactivated. The activated signal may be determined in response to the refresh counting information REF<0:2>. When the second refresh counting information REF<2> is 0, the second refresh control unit 750 may activate the second refresh signal REF2_BK0 one or more times in case where the first refresh counting information REF<0:1> is '00', activate the second refresh signal REF2_BK1 one or more times in case where the first refresh counting information REF<0:1> is '10', activate the second refresh signal REF2_BK2 one or ore times in case where the refresh counting information REF<0:1> is '01' and activate the second refresh signal REF2_BK3 one or more times in case where the first refresh counting information REF<0:1> is '11'. When the second refresh counting information REF<2> is 1, the second refresh control unit 750 may not activate the second refresh signals REF2_BK0 to REF2_BK3 even through the refresh signal REF1_LAST is deactivated.

Based on the above-described configuration, the entire operation of the refresh controller 540 will be described as follows.

(1) When the Refresh Command is Inputted for the First Time

Since the first refresh counting information REF<0:1> is '00', the first refresh control unit 740 may activate the first refresh signals in order of REF1_BK0, REF1_BK1, REF1_BK2, and REF1_BK3. Since the refresh counting information <0:2> is '000', the refresh signal selection unit 730 may select the first refresh signal REF1_BK3 and output the selected signal as the refresh signal REF1_LAST. The second refresh control unit 750 may activate the second refresh signal REF2_BK0 one or more times, when the refresh signal REF1_LAST (e.g., REF1_BK3) is deactivated in a state where the refresh counting information REF<0:2> is '000'. When a preset time elapses after the refresh signal REF1_LAST (e.g., REF1_BK3) is deactivated, the second refresh counting information REF<2> may be counted from '0' to '1'. When a preset time elapses after the refresh signal REF1_LAST (e.g., REF1_BK3 is deactivated, the first refresh control unit 740 may activate the first refresh signals REF1_BK0 to REF1_BK3 at different times. At this time, since the refresh counting information REF<0:2> is '001', the first refresh control unit 740 may activate the first refresh signals in order of REF1_BK3, REF1_BK2, REF1_BK1, and REF1_BK0. Since the refresh counting information REF<0:2> is '001', the refresh signal selection unit 730 may select the first refresh signal REF1_BK0 and output the selected signal as the refresh signal REF1_LAST. When the signal REFS is deactivated after the refresh operation is completed, the first refresh counting information REF<0:1> may be counted as '10'.

(2) When the Refresh Command is Inputted for the Second Time

Since the first refresh counting information REF<0:1> is '10', the first refresh control unit 740 may activate the first refresh signals in order of REF1_BK1, REF1_BK2, REF1_BK3, and REF1_BK0. Since the refresh counting information <0:2> is '100', the refresh signal selection unit 730 may select the first refresh signal REF1_BK0 and output the selected signal as the refresh signal REF1_LAST. The second refresh control unit 750 may activate the second refresh signal REF2_BK1 one or more times when the refresh signal REF1_LAST (e.g., REF1_BK0) is deactivated in a state where the refresh counting information REF<0:2> is '100'. When a preset time elapses after the refresh signal REF1_LAST (e.g., REF1_BK0) is deactivated, the second refresh counting information REF<2> may be counted from '0' to '1'. When a preset time elapses after the refresh signal REF1_LAST (e.g., REF1_BK0) is deactivated, the first refresh control unit 740 may activate the first refresh signals REF1_BK0 to REF1_BK3 at different times. At this time, since the refresh counting information REF<0:2> is '101', the first refresh control unit 740 may activate the first refresh signals in order of REF1_BK0, REF1_BK3, REF1_BK2, and REF1_BK1. Since the refresh counting information REF<0:2> is '101' the refresh signal selection unit 730 may select the first refresh signal REF1_BK1 and output the selected signal as the refresh signal REF1_LAST. When the signal REFS is deactivated after the refresh operation is completed, the first refresh counting information REF<0:1> may be counted as '01'.

(3) When the Refresh Command is Inputted for the Third Time

Since the first refresh counting information REF<0:1> is '01', the first refresh control unit 740 may activate the first refresh signals in order of REF1_BK2, REF1_BK3, REF1_BK0, and REF1_BK1. Since the refresh counting information <0:2> is '010', the refresh signal selection unit 730 may select the first refresh signal REF1_BK1 and output the selected signal as the refresh signal REF1_LAST. The second refresh control unit 750 may activate the second refresh signal REF2_BK2 one or more times when the refresh signal REF1_LAST (e.g., REF1_BK1) is deactivated in a state where the refresh counting information REF<0:2> is '010'. When a preset time elapses after the refresh signal REF1_LAST (e.g., REF1_BK1) is deactivated, the second refresh counting information REF<2> may be counted from '0' to '1'. When a preset time elapses after the refresh signal REF1_LAST (e.g., REF1_BK1) is deactivated, the first refresh control unit 740 may activate the refresh signals REF1_BK0 to REF1_BK3 at different times. At this time, since the refresh counting information REF<0:2> is '011', the first refresh control unit 740 may activate the first refresh signals in order of REF1_BK1, REF1_BK0, REF1_BK3, and REF1_BK2. Since the refresh counting information REF<0:2> is '011', the refresh signal selection unit 730 may select the first refresh signal REF1_BK2 and output the selected signal as the refresh signal REF1_LAST. When the signal REFS is deactivated after the refresh operation is completed, the first refresh counting information REF<0:1> may be counted as '11'.

(4) When the Refresh Command is Inputted for the Fourth Time

Since the first refresh counting information REF<0:1> is '11', the first refresh control unit 740 may activate the first refresh signals in order of REF1_BK3, REF1_BK0, REF1_BK1, and REF1_BK2. Since the refresh counting information <0:2> is 110', the refresh signal selection unit 730 may select the first refresh signal REF1_BK2 and output the selected signal as the refresh signal REF1_LAST. The second refresh control unit 750 may activate the second refresh signal REF2_BK1 one or more times when the refresh signal REF1_ LAST (e.g., REF1_BK2) is deactivated in a state where the refresh counting information REF<0:2> is 110'. When a preset time elapses after the refresh signal REF1_LAST (e.g. REF1_BK2) is deactivated, the second refresh counting information REF<2> may be counted from '0' to '1'. When a preset time elapses after the refresh signal REF1_LAST (e.g., REF1_BK2) is deactivated, the first refresh control unit 740 may activate the refresh signals REF1_BK0 to REF1_BK3 at different times. At this time, since the refresh counting information REF<0:2> is '111', the first refresh control unit 740 may activate the first refresh signals in order of REF1_BK2, REF1_BK1, REF1_BK0, and REF1_BK3. Since the refresh counting information REF<0:2> is '111', the refresh signal selection unit 730 may select the first refresh signal REF1_BK3 and output the selected signal as the refresh signal REF1_LAST. When the signal REFS is deactivated after the refresh operation is completed, the first refresh counting information REF<0:1> may be counted as '00'.

Based on the above-described configuration, the refresh controller 540 may control the memory block which is first refreshed in the first normal refresh operation, such that the memory block is finally refreshed in the second normal refresh operation, and control the memory block to be target-refreshed. Furthermore, whenever the refresh command REF is applied, the refresh controller 540 may change the memory block to be target-refreshed.

Figure 8:
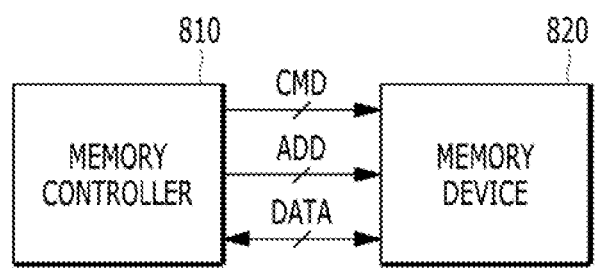
FIG. 8 is a block diagram illustrating a memory system in accordance with an embodiment of the present invention.

FIG. 8 is a block diagram illustrating a memory system in accordance with an embodiment of the present invention.

As illustrated in FIG. 8, the memory system may include a memory controller 810 and a memory device 820.

The memory controller 810 may control the operation of the memory device 820 by inputting commands CMDs and addresses ADDs to the memory device 820, and exchange data DATA with the memory device 820 during a read or write operation. The operation of applying an active, precharge, or refresh command to the memory device 820 may be performed by transmitting the command CMDs. During a refresh operation, a counted address CNT_ADD which is internally generated by the memory device 820 may be used. Thus, the memory controller 810 does not need to transmit the addresses ADDs to the memory device 820.

The memory device 820 may perform a refresh operation in response to a refresh command applied through the commands CMDs from the memory controller 810. At this time, the refresh operation may be performed in such a manner as described with reference to FIGS. 4 to 7. The memory controller 810 may periodically apply a refresh command to the memory device 820. After the active command is applied to the memory device from the memory controller 810, a read or write command may be applied so that the memory device 820 and the memory controller 810 exchange data DATA. After the above-described operation is completed, the memory controller 810 may apply the precharge command to the memory device 820 to precharge the activated word line.

The memory device 820 may finally refresh a memory block, which is first refreshed in the first normal refresh operation, during the second normal refresh operation, and then target-refresh the memory block. Thus, the memory device 820 may minimize the time required for the refresh operation, while performing both of the normal refresh operation and the target refresh operation.

In accordance with the embodiments of the present invention, the memory device and the memory system may change the order in which a plurality of memory blocks are refreshed during a normal refresh operation, and secure the time required for performing a target refresh operation. Thus, the memory device and the memory system may reduce the time required for performing the normal refresh operation and the target refresh operation.

Furthermore, the memory device and the memory system may reduce errors, which may occur due to memory cells having insufficient data retention time, through the target refresh operation.

Although various embodiments have been described for illustrative purposes, it will be apparent to those skilled in the art that various changes and modifications may be made without departing from the spirit and scope of the invention as defined in the following claims.

What is claimed is:

1. A memory device comprising:
   a plurality of memory blocks;
   an address counter suitable for generating a counted address which is used for a normal refresh operation and changed when all the memory blocks are refreshed;
   a target address generator suitable for generating a target address used for a target refresh operation, wherein the target address corresponds to an address of a word line to be additionally refreshed in the memory blocks; and
   a refresh controller suitable for controlling the memory blocks to be refreshed at different times during a first normal refresh operation, controlling a memory block among the memory blocks, which is first refreshed in the first normal refresh operation, to be refreshed through the target refresh operation, and controlling the memory block, which is first refreshed in the first normal refresh operation, to be refreshed last during a second normal refresh operation, based on the refresh command.

2. The memory device of claim 1, wherein the refresh controller changes the memory block, which is first refreshed in the first normal refresh operation, when a next refresh command is applied.

3. The memory device of claim 2, wherein the refresh controller changes the memory block to be refreshed through the target refresh operation, when the next refresh command is applied.

4. The memory device of claim 1, wherein the refresh controller controls the target refresh operation to be started after the memory block, which is refreshed last in the first normal refresh operation, is completely refreshed.

5. The memory device of claim 1, wherein the target address includes the address of a word line having a shorter data retention time than other word lines.

6. The memory device of claim 1, wherein the target address includes the address of a word line adjacent to a highly active word line of which the number of activations is equal to or more than a reference number, the active frequency is equal to or more than a reference frequency, or the active time is equal to or more than a reference time.

7. The memory device of claim 1, wherein the refresh controller controls the memory blocks such that the order in which the memory blocks are refreshed in the second normal operation becomes reverse to the order in which the memory blocks are refreshed in the first normal refresh operation.

8. The memory device of claim 1, wherein the counted address is changed when the memory block, which is refreshed last in the first or second normal refresh operation, is completely refreshed.

9. The memory device of claim 8, wherein the refresh controller includes a selection unit suitable for selecting a control signal corresponding to the first and second normal refresh operations of the memory block, which is refreshed last, among control signals corresponding to the memory blocks, based on counting information generated by counting based on the refresh command and the selected control signal, and
   the address counter changes the counted address based on the selected control signal.

10. The memory device of claim 9, wherein the refresh controller may determine the order in which the memory blocks are refreshed in the first normal refresh operation, a memory block to be target-refreshed among the memory blocks, and the order in which the memory blocks are refreshed in the second normal refresh operation, based on the counting information.

\* \* \* \* \*